Oct. 28, 1958 H. W. HENKELS 2,858,489
POWER TRANSISTOR
Filed Nov. 4, 1955

WITNESSES:
Bernard R. Giegrey
Charles F. Renz

INVENTOR
Herbert W. Henkels
BY
F. E. Browder
ATTORNEY

United States Patent Office 2,858,489

Patented Oct. 28, 1958

2,858,489

POWER TRANSISTOR

Herbert W. Henkels, Pittsburgh, Pa., assignor to Westinghouse Electric Corporation, East Pittsburgh, Pa., a corporation of Pennsylvania Application November 4, 1955, Serial No. 544,897

6 Claims. (Cl. 317—235)

This invention relates to semiconductor devices and methods of manufacture and more particularly to junction-type transistors suitable for high power applications.

Semiconductor materials such as germanium or silicon may be classified in this art as P-type or N-type materials depending on the type of conductivity. The N-type material is characterized in that an excess of electrons exist within the material and, therefore, the predominant conduction carriers are electrons. The P-type material is characterized in that a deficiency of electrons in the material exists and the conduction carriers are the so-called holes. The conduction in a P-type material takes place due to the apparent movement of the electron vacancies or holes within the material which act like positive charges.

The determinant as to whether a semiconductor body is of N-type or P-type conductivity is the amount and type of certain impurities added to the pure material. These impurities may be donor impurities such as antimony, phosphorus or arsenic falling in group V of the periodic table which add excess electrons to produce an N-type material, or they may be acceptor impurities such as gallium, aluminum and indium falling in group III of the periodic table which absorb electrons to produce a P-type material.

If a body of semiconductor material is made having contiguous zones of N-type and P-type material, the junction or transition region which is referred to as a P–N junction formed between these two zones acts as a rectifying barrier or layer. This transition region has a low impedance to current flow from the P-type to N-type material but of a very high impedance to current flow from the N-type to P-type material.

A transistor device is a three terminal semiconductor device having a body wherein a zone of one conductivity type is sandwiched between two zones of opposite conductivity types to form two P–N junctions. The transistor is utilized to obtain current, voltage and power amplification. The characteristics and properties of a junction transistor are more fully described in an article entitled, "Operation of Junction Transistors" by A. Coblenz and H. L. Owens in the August 1953 issue of Electronics. Briefly, the low power type transistor that is well known in the art consists of a device in which a semiconductor body in the form of a flat wafer with three layers or zones along the thickness dimension of the wafer with electrode terminals connected such that one of the outer layers is the emitter electrode and the other outer layer is the collector electrode and the intermediate layer is the base electrode.

In the manufacture of large area junction transistors for practical power uses, certain difficulties are encountered. The semiconductor wafer must be made in some cases of the order of only eight mils in thickness. Germanium and silicon are brittle materials and when cut into wafers of large area of the order of one square inch for power purpose with a thickness dimension of eight mils, the wafers are extremely fragile and easily broken.

It is, therefore, necessary to design transistors so that they are adequately supported and protected from being subjected to mechanical stress in order to prevent breakage of the material.

It is also necessary to provide for the best possible heat transfer from the semiconductor body to prevent excessive temperature rise. The semiconductor materials, especially germanium, have quite definite temperature limits which should not be exceeded in operation. If these temperature limits are exceeded, the characteristics of the semiconductive device may be changed permanently. It is therefore important to provide large area contact for current carrying electrodes and to remove heat from the wafer.

It is also necessary in the use of power transistors to obtain a low as possible resistance between the base electrode and the emitter electrode, especially in the utilization of transistors to switching operations. This makes it desirable to have small current flow paths from the emitter electrode to the base electrode. It is found that in the case of silicon that these flow paths may be of the order of 3 mils.

It is, therefore, an object of this invention to provide an improved power transistor device.

It is another object to provide a transistor device of a design such that small current flow paths will exist between the emitter and base electrodes.

It is another object to provide an improved power transistor device to obtain broad area metal surface electrode structures to which heat exchanger surfaces may be connected.

It is another object to provide a method of manufacturing an electrode contact for a semiconductor device to provide uniform electrode contacts for mass production.

These and other objects are effected by my invention as will be apparent from the following description taken in accordance with the accompanying drawing and throughout which like reference characters indicate like parts and in which.

Figure 1:
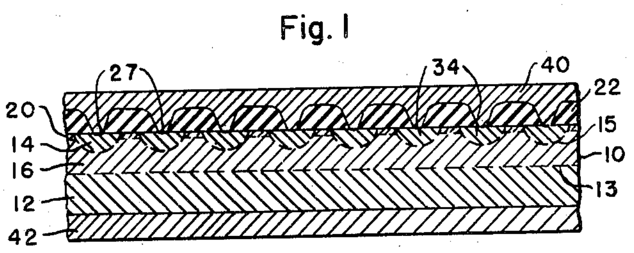
Figure 1 is a transverse sectional view of a semiconductor junction transistor device embodying my invention.
Figure 2:
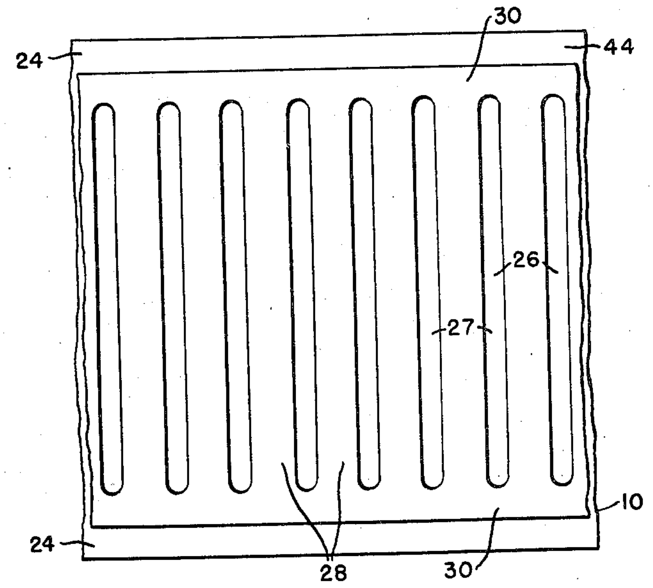
Fig. 2 is a top view of a semiconductor device shown in Fig. 1 illustrating the top surface of the device prior to attachment of electrode terminals.

Referring in detail to Figs. 1 and 2, the preferred embodiment of my invention is illustrated in an N–P–N junction type transistor comprised of a semiconductor body 10 of a suitable semiconductor material such as germanium or silicon. The body 10 is essentially comprised of outside zones or regions 12 and 14 of one type conductivity material and an intermediate contiguous and integral region or zone 16 of opposite conductivity type forming two transition junctions 13 and 15. For convenience in discussion, the device described will be limited to an N–P–N type junction transistor of silicon material in which two exterior zones 14 and 12 will be of a material of a conductivity of N-type and the intermediate zone 16 will be of a conductivity of a P-type. This invention is not limited to an N–P–N type junction transistor but also includes a P–N–P type or any other suitable semiconductive material and impurities.

The structure of the device shown in Figs. 1 and 2 can best be described by the method of manufacture. A P-type crystal is obtained of a resistivity of the order of 10 ohm cm., a thickness depending on the semiconductor material and the diffusion length and major dimension depending on power handling capacity desired.

In the specific case of silicon which may have a diffusion length of the order of 2 to 3 mils, the crystal may be of the order of 8 mils in thickness and the major dimensions may be of the order of one inch by one inch. The silicon crystal of given resistivity may be obtained by any suitable method well known in the art.

Figure 3:
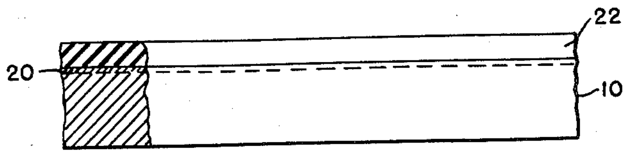
Fig. 3 is a transverse sectional view of the semiconductor body at one point in the manufacturing process.

The upper surface P-type silicon crystal is then exposed to a vapor of a suitable acceptor impurity such as pure aluminum at a suitable temperature and time period to produce a more strongly P-type surface layer 20 on the upper surface of the wafer as illustrated in Fig. 3. The resistivity of the original P-type crystal was of the order of 10 ohm cm., while the more strongly P-type top surface region should be of the order of .01 ohm cm. This forms in effect a thin conductive upper surface 20 on the crystal.

The next step in the manufacture is to place a film 22 of an inorganic insulation such as silicon dioxide on the top surface region of the semiconductor body 10. The film 22 may be obtained by surface reaction of the semiconductor body by the evaporation of an insulating film or the anodization of the semiconductor surface. The semiconductor body 10 may be masked so that the base connection area 24 as shown in Fig. 2 is not coated. The coating 22 should be of a thickness of about 1 to 2 mils.

Two strip areas or base contact areas 24 on opposite edges of the top surface of the body 10 should be masked prior to evaporation of insulation layer 22. The strips 24 need only be of the order of 1/16 inch wide to provide means for connecting an electrode terminal thereto. The emitter contact area 26 is in the form of parallel lines or elements 27 with insulation areas 28 between elements 27.

Since a high current device is desired and lifetimes on germanium junctions are small and in silicon junctions are very small, it is necessary to closely space the emitter electrode. This close spacing is not possible by a masking technique. However, with spacing of the order of 100 lines per inch a scribing technique is highly satisfactory. The scribing may be accomplished by a ruling engine such as used in the preparation of diffraction gratings. In this technique a continuous insulating film 22 is evaporated over the entire upper surface of the body 10 with the exception of the masked off base contact areas 24 and then the emitter contact elements 27 are scribed off, leaving an insulating strip 28 between each of the linear emitter contact areas 27. A strip 30 of insulation about 1/16 inch wide is left between the ends of emitter contact areas 27 and the base contact areas 24.

The upper surface with scribed insulating coating 22 and the masked off base strips 24 and lower surface of the semiconductor body 10 are then exposed to vapor of a donor type impurity such as phosphorus at about 1000 degrees centigrade for a period of time to permit the diffusion of phosphorus into the body 10 surrounding the emitter contact areas 27 and the production of the emitter region 14 in the form of parallel inclusions 34 beneath and surrounding each of the exposed emitter contact areas 27 as shown in Fig. 1. The phosphorus will also diffuse into the lower surface of body 10 to form the planar collector region 12 within the semiconductive body 10. By this process, the emitter-base P–N junction 15 and the collector-base P–N junction 13 are formed within the body. It may be desirable to mask the lower surface of the body 10 and form the collector junction 13 at a later time by utilization of fusion techniques using antimony or arsenic alloys such as described in the above mentioned article.

The semiconductive body 10 is now completely formed and consists of essentially two layers or regions 12 and 16 along the thickness dimension comprising a lower N-type collector layer 12 and a P-type upper base layer 16. The upper P-type base region has a plurality of N-type emitter inclusion zones 34 in the surface thereof, thereby forming the N–P–N type junction transistor. Intermediate of the emitter inclusion zones 34 on the surface region of the P-type base layer 16 are surface regions of more strongly P-type conductive materials.

The next step in the assembly of the semiconductor device is the securing of electrode contacts to the base contact surface 24, emitter contact surface elements 27 on the upper surface and the entire lower surface of the body 10 forming the collector contact surface of the semiconductive body. One possible method is to again mask the base contact surface 24 and the small adjoining insulator area 28 on the upper surface and evaporate a conductive material such as silver over the scribed or ruled insulating surface, making a good contact to the emitter contact surfaces 27 and also evaporate onto the lower surface to form a collector electrode 42. The emitter electrode 40 thus formed provides a large plane area to which external connections can be made with ease. This type contact may be referred to as a multiple type connector. This large plane area of the emitter electrode 40 provides means for securing heat conductive terminal of large area to the body 10 to rapidly remove the heat from the semiconductive body 10 and to also handle large currents. It should also be noted that the collector electrode 42 that is formed is also of the conventional large area type which provides the main support for the body 10 and also the main heat removal means. The collector electrode 42 may be formed at the same time and in similar manner as the emitter electrode 40, or in the case where fusion techniques as previously mentioned were used, the metallic contact electrode 42 would be formed in the fusion. The base electrode 44 is connected directly to the strongly P-type material of the upper P-type layer by means of suitable low temperature solder.

It is seen that the resulting structure provides essentially a grid like high conductive base contact 44 in the form of the strongly P-type material to the body 10 over the entire upper surfare. By this structure it is seen that small current paths exist between emitter electrode 40 and base electrode network 44 and give a very low emitter to base resistance. The structure also gives short current paths between the base electrode network 44 and the collector electrode 42. The provision of the strongly P-type material in the form of the base network 44 between the emitter inclusions zones 27 allows the area of the transistor to be quite large before the resistance drop between the emitter to base connection is appreciable.

The structure and method of manufacture of the device as described herein gives a highly efficient power transistor especially in the case of silicon.

The diffusion length of carriers in a typical available germanium is of the order of 10 mils while in silicon is of the order of 2 to 3 mils. In a power transistor it is desirable that the distance between the emitter and base contact be not greater than about two times the diffusion length. This means that the distance between the lower point of an emitter inclusion zone 27 should be of the order of 5 mils from a point on the upper surface of the base layer 16 intermediate between adjacent inclusions 34. By the diffusion technique it is also possible to control the distance of the emitter junction 15 and the collector junction 13 from the surface. It is found that this distance should be of the order of 2 diffusion lengths or 5 mils in the specific example. The distance between the emitter junction 15 and the collector junction 13 should be of the order of 1/3 of a diffusion length or less, or less than one mil. This type of structure gives an increased emitter efficiency and decreases the saturation current in the collector.

While I have shown my invention in only one form, it will be obvious to those skilled in the art that it is not so limited, but is susceptible of various other changes and modifications without departing from the spirit and scope thereof.

I claim as my invention:

1. A high power transistor comprising a semiconductor crystal wafer having major dimensions much greater than its thickness and having along its thickness dimension a first zone of predetermined type conductivity material and a second zone contiguous with said first zone of an opposite type conductivity material to form a transition junction therebetween, the surface region of said first zone of higher similar conductivity type material than the remaining porion of said first zone, inclusions within a substantial portion of the surface of said first zone of a material of similar type conductivity material as said second zone, a first metallic conductive electrode having a plurality of projections thereon in contact with said inclusions, a metallic conductive electrode in contact with the surface region of said second zone, and a third metallic conductive electrode in contact with a portion of said higher conductivity material surface region of said first zone.

2. A high power transistor comprising a semiconductor crystal wafer having major dimensions much greater than its thickness and having along its thickness dimension a collector zone of predetermined type conductivity material and a base zone contiguous with said collector zone and of opposite type conductivity material to form a transition junction therebetween, a plurality of parallel linear inclusion zones within the surface of said base zone of similar conductivity to said collector zone, the surface region of said base zone intermediate of said emitter zones of higher similar conductivity type material than the remaining portion of said base zone, a first metallic conductive electrode having a plurality of projections thereon in contact with said emitter zones, a second metallic conductive electrode positioned along the exterior portion of said base zone and in contact with the higher conductivity type material surface region, and a third metallic conductive electrode in contact with the surface of said collector zone.

3. The method of manufacturing a multiple linear element type contact electrode for a semiconductor device comprising the steps of depositing a continuous coating of an insulating material on the surface of said semiconductor device, scribing said insulating coating off in a predetermined geometrical pattern to obtain a plurality of linear exposed areas on the surface of said semiconductor device, converting a region in the form of inclusion zones beneath each of said exposed linear areas on the surface region of said semiconductor device to a predetermined type conductivity material, and depositing an electrical conductive material over the entire upper surface of the scribed insulator coated surface to form a planar type electrode contact with projections thereon in contact with said inclusion zones.

4. The method of manufacturing a power transistor having a multiple emitter type contact on one surface of the semiconductor body comprising the steps of converting the surface region of one side of said semiconductive body to a higher type conductivity material than the remaining portion, depositing a continuous coating of an insulating material on a substantial portion of the surface of the higher conductivity type material surface, removing said insulating coating in a predetermined geometrical pattern to obtain a plurality of exposed areas separated by insulating coating, converting the immediate semiconductor material beneath each of said exposed areas by diffusion techniques to a different type of conductivity material than the remaining portion of said semiconductive body, and applying a conductive coating over the entire scribed surface of said semiconductive body to provide contacts with each of said areas between said insulating strips and providing a large planar electrode common to all of said contact strips.

5. A high power transistor comprising a semiconductor crystal wafer having major dimensions much greater than its thickness and having along its thickness dimension a first zone of predetermined type conductivity material and a second zone contiguous with said first zone and of opposite type conductivity material to form a transition junction therebetween, a plurality of inclusion zones within the surface of said second zone of similar conductivity to said first zone, a surface region of said second zone intermediate of said inclusion zones of higher similar conductivity type material than the remaining portion of said first zone, a first metallic conductive electrode having a plurality of projections thereon in contact with said inclusion zones, a second metallic conductive electrode in contact with the surface region of said second zone and a third metallic conductive electrode in contact with the surface region of said first zone.

6. The method of manufacturing a multiple type contact electrode for a semiconductor wafer comprising the steps of depositing a continuous coating of an insulating material on the surface of said semiconductor wafer, removing said insulating coating in a predetermined geometrical pattern by scribing to obtain a plurality of exposed areas on the surface of said wafer separated by insulation, fusing an electrically conductive electrode to each of said exposed areas on the surface of said wafer to provide a substantially planar electrode contact of similar area as the surface of said wafer.

References Cited in the file of this patent

UNITED STATES PATENTS

| | | |
|---|---|---|
| 2,345,122 | Herrmann | Mar. 28, 1944 |
| 2,680,220 | Starr et al. | June 1, 1954 |

UNITED STATES PATENT OFFICE
CERTIFICATE OF CORRECTION

Patent No. 2,858,489 October 28, 1958

Herbert W. Henkels

It is hereby certified that error appears in the above numbered patent requiring correction and that the said Letters Patent should read as corrected below.

Column 1, line 59, after "body" insert -- is --; column 3, line 7, after "surface" insert -- of the --; line 21, after "body" insert a comma; column 4, line 22, after "securing" insert -- a --; column 6, line 3, for "the", first occurrence, read -- a --; line 16, for "scribed" read -- one --; same column 6, line 31, for "first", first occurrence, read -- second --.

Signed and sealed this 7th day of December 1965.

(SEAL)
Attest:

ERNEST W. SWIDER
Attesting Officer

EDWARD J. BRENNER
Commissioner of Patents